US011835869B2

(12) United States Patent
Ota et al.

(10) Patent No.: US 11,835,869 B2
(45) Date of Patent: Dec. 5, 2023

(54) EXPOSURE APPARATUS, EXPOSURE METHOD, AND METHOD OF MANUFACTURING ARTICLE

(71) Applicant: CANON KABUSHIKI KAISHA, Tokyo (JP)

(72) Inventors: Kazuki Ota, Tochigi (JP); Takafumi Miyaharu, Tochigi (JP); Yuki Saito, Tochigi (JP); Masaki Imai, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/062,072

(22) Filed: Dec. 6, 2022

(65) Prior Publication Data
US 2023/0185205 A1 Jun. 15, 2023

(30) Foreign Application Priority Data
Dec. 15, 2021 (JP) .................................. 2021-203601

(51) Int. Cl.
*G03F 7/00* (2006.01)
(52) U.S. Cl.
CPC ...... *G03F 7/70725* (2013.01); *G03F 7/70641* (2013.01); *G03F 7/70775* (2013.01)
(58) Field of Classification Search
CPC ............. G03F 7/70725; G03F 7/70641; G03F 7/70775
See application file for complete search history.

(56) References Cited

U.S. PATENT DOCUMENTS

| | | | | |
|---|---|---|---|---|
| 7,812,927 B2 * | 10/2010 | Kurosawa | ............. | G03F 9/7026 355/53 |
| 9,268,240 B2 * | 2/2016 | Sato | .................... | G03F 7/70641 |
| 9,904,179 B2 * | 2/2018 | Koizumi | ............ | G03F 7/70525 |
| 10,133,177 B2 * | 11/2018 | Nishimura | ................ | G03F 7/32 |

FOREIGN PATENT DOCUMENTS

| | | |
|---|---|---|
| JP | 2005129674 A | 5/2005 |
| JP | 2016100590 A | 5/2016 |

* cited by examiner

*Primary Examiner* — Hung V Nguyen
(74) *Attorney, Agent, or Firm* — ROSSI, KIMMS & McDOWELL LLP

(57) ABSTRACT

An exposure apparatus including an obtainment unit configured to obtain, for each of a plurality of exposure regions on a substrate, surface positions in a height direction in the exposure region, and a control unit configured to control, based on the obtained surface positions, driving of a substrate stage in the height direction, wherein the control unit obtains an approximate surface approximately representing a cross-sectional shape of a surface of the exposure region from the obtained surface positions obtained, and for a first exposure region for which information related to the approximate surface does not exceed a predetermined range, controls the driving based on a correction value related to the driving obtained from an approximate surface approximately representing a cross-sectional shape of a surface of the exposure region that has been exposed prior to the first exposure region.

12 Claims, 12 Drawing Sheets

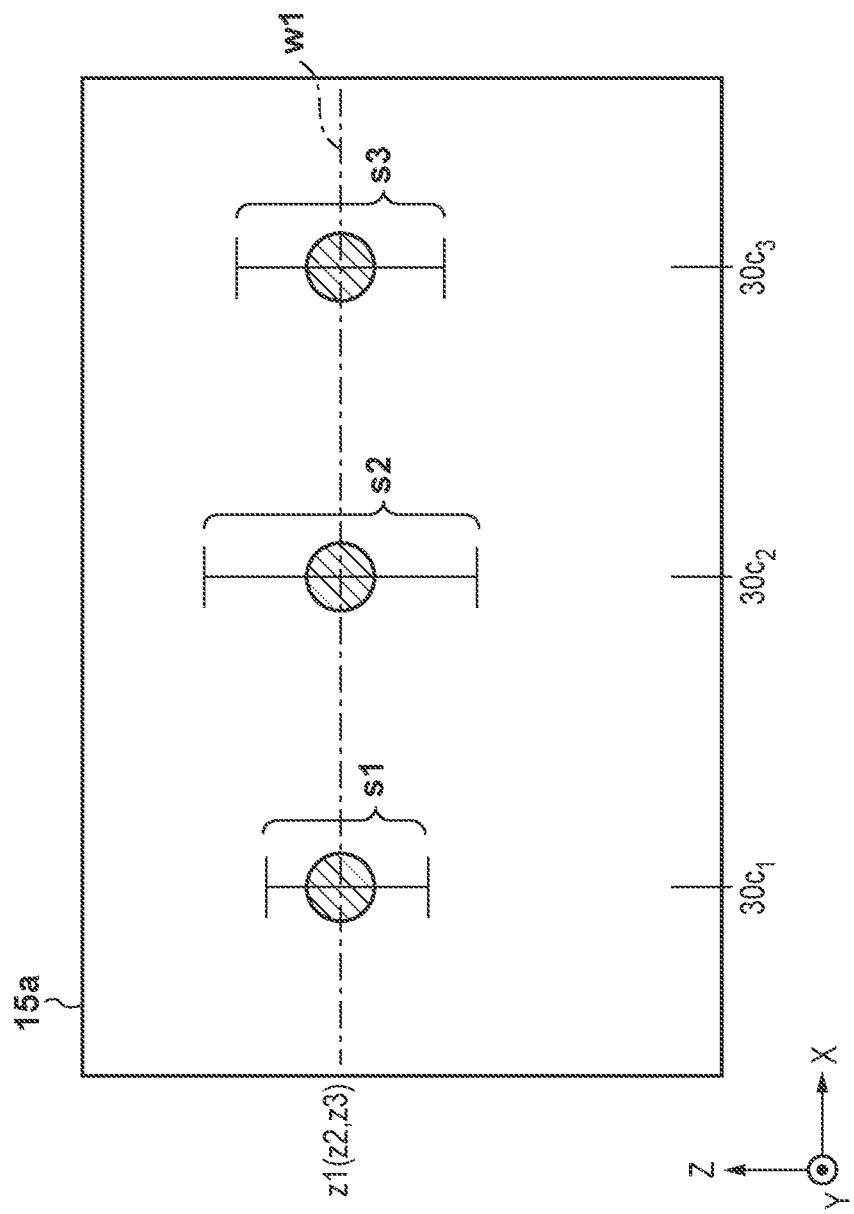

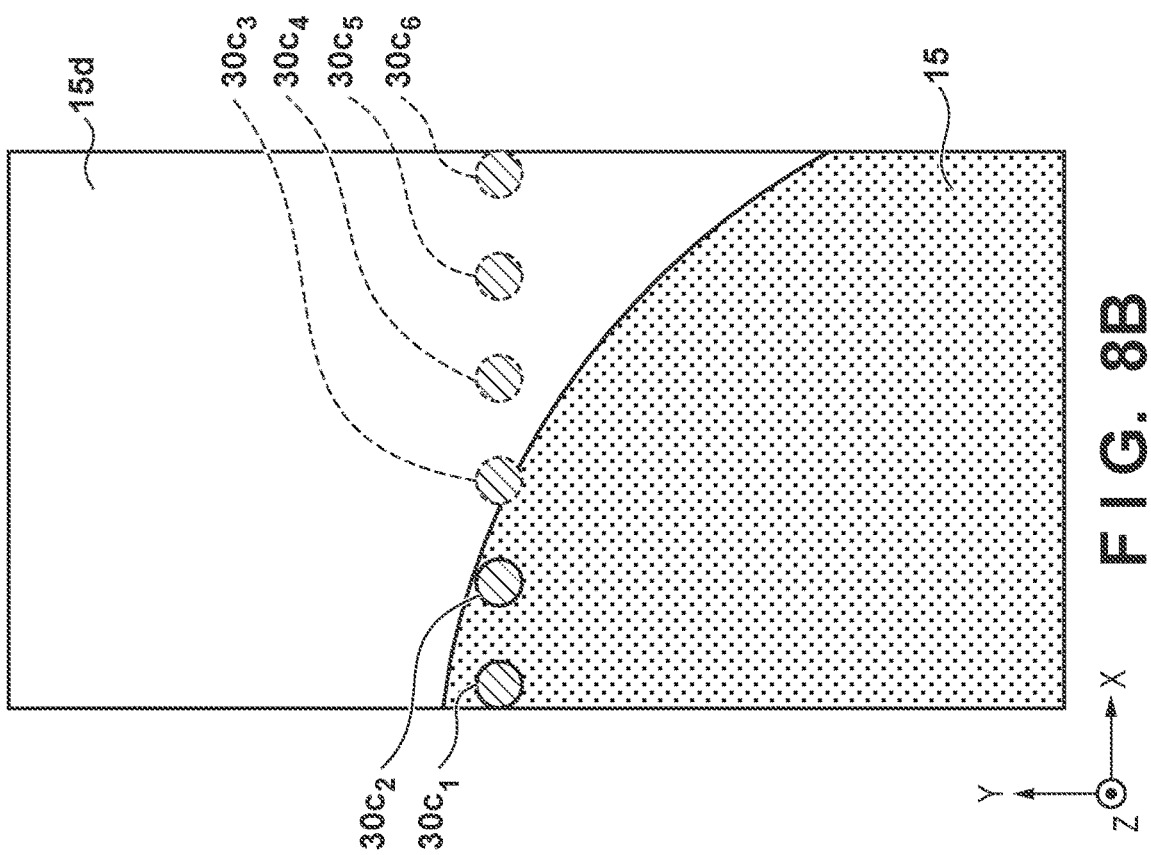
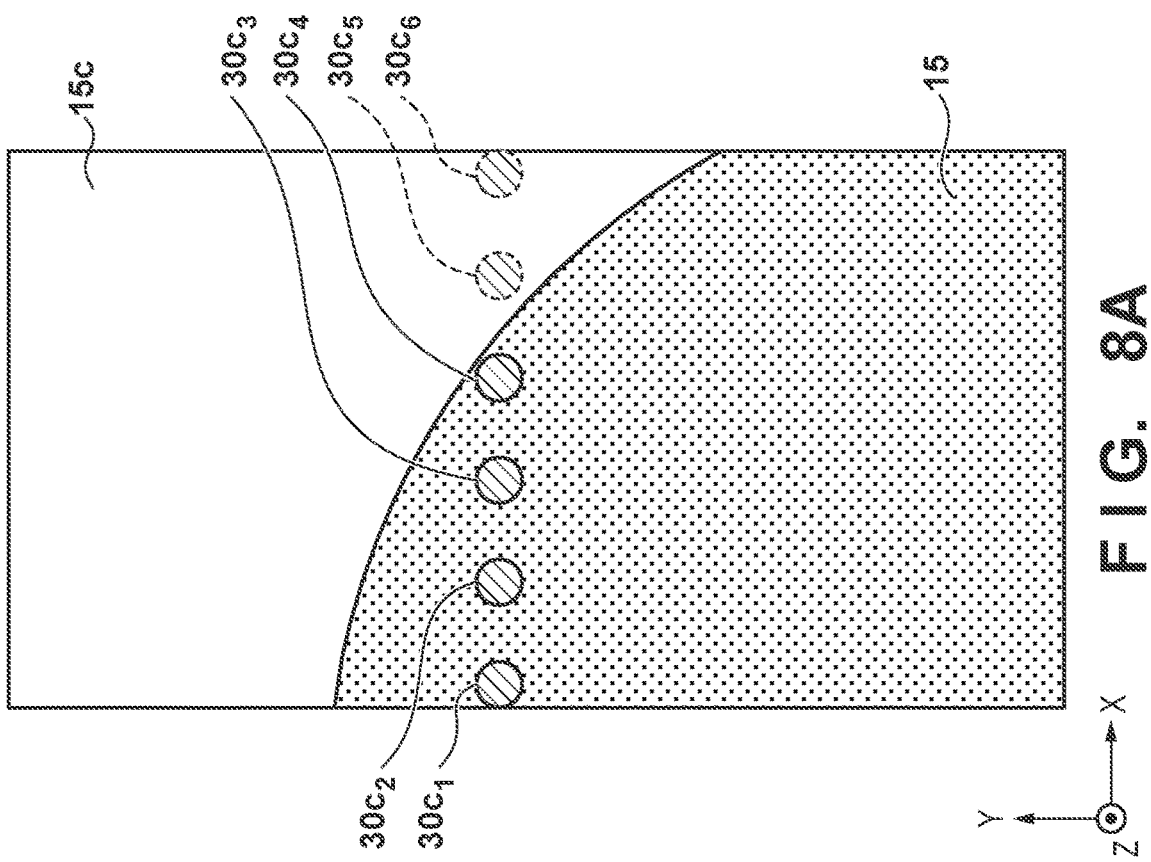

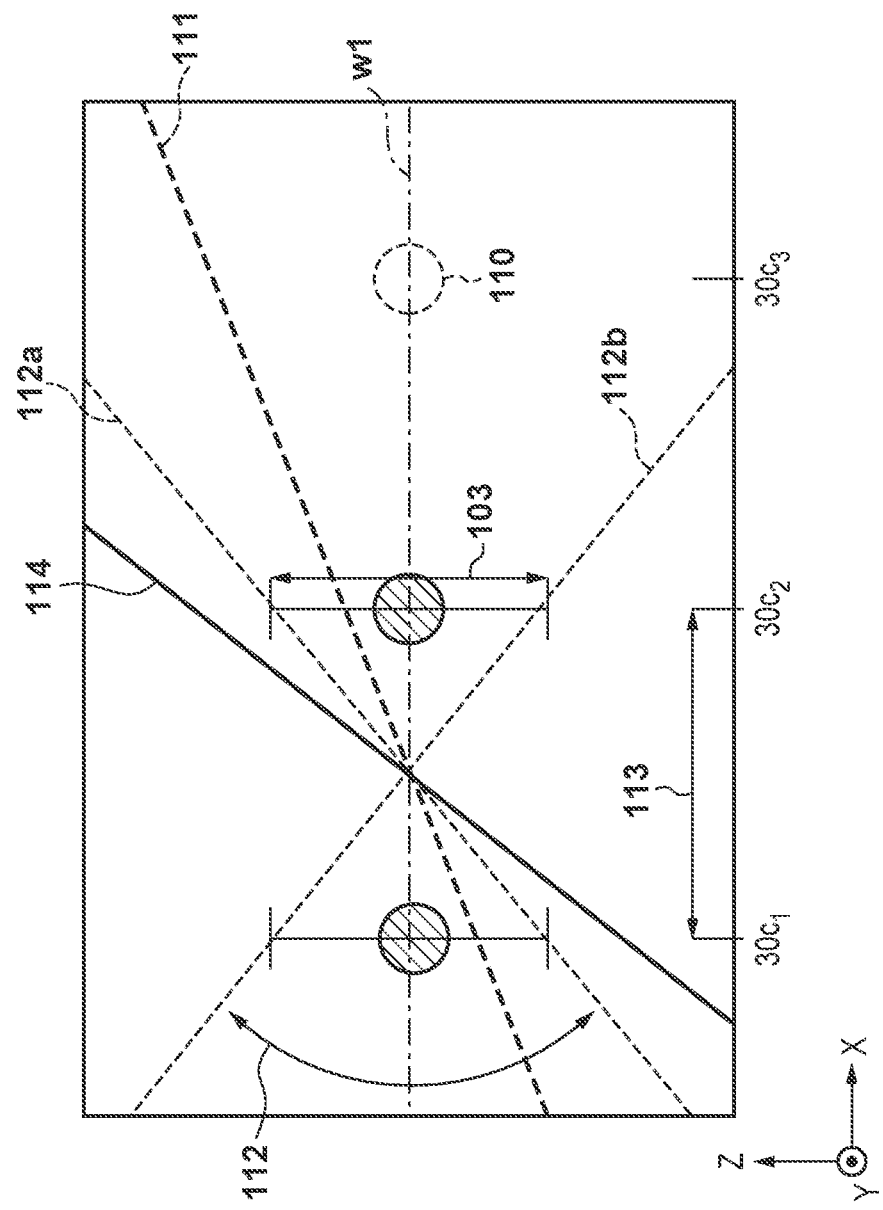

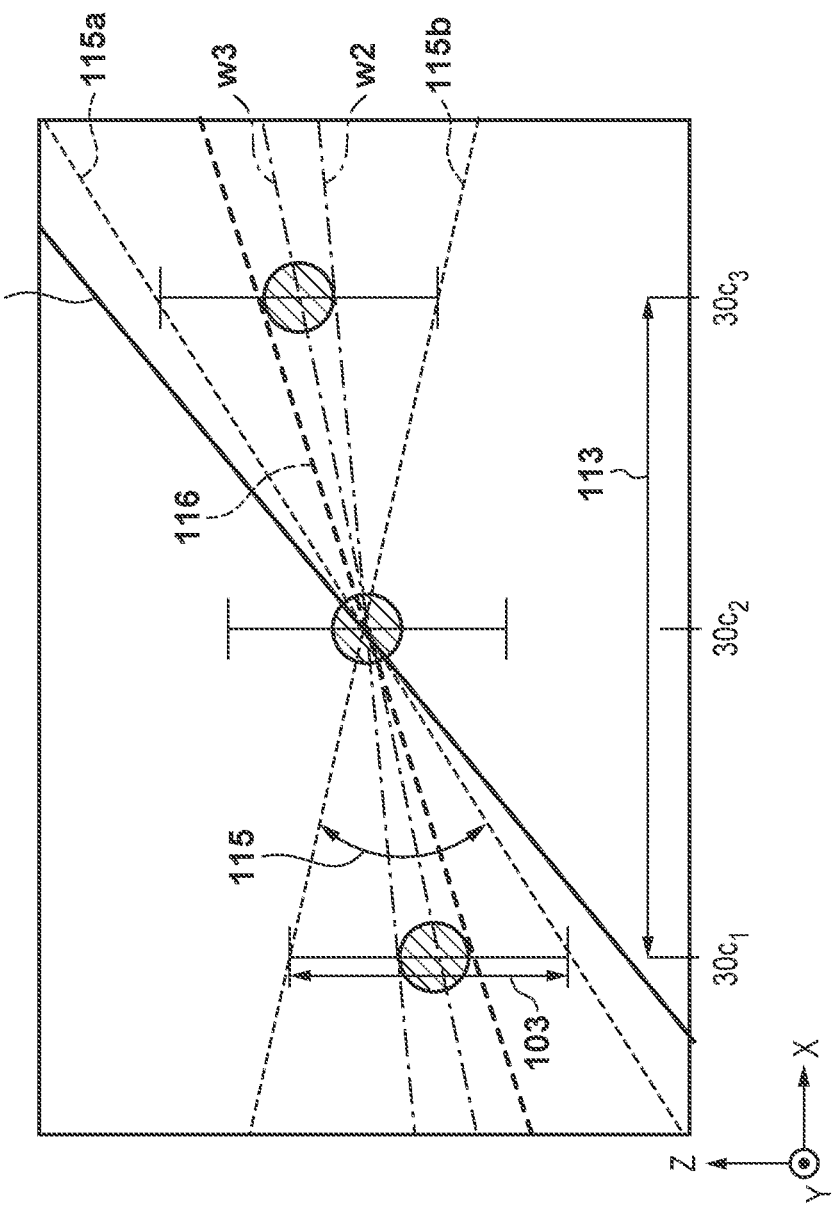

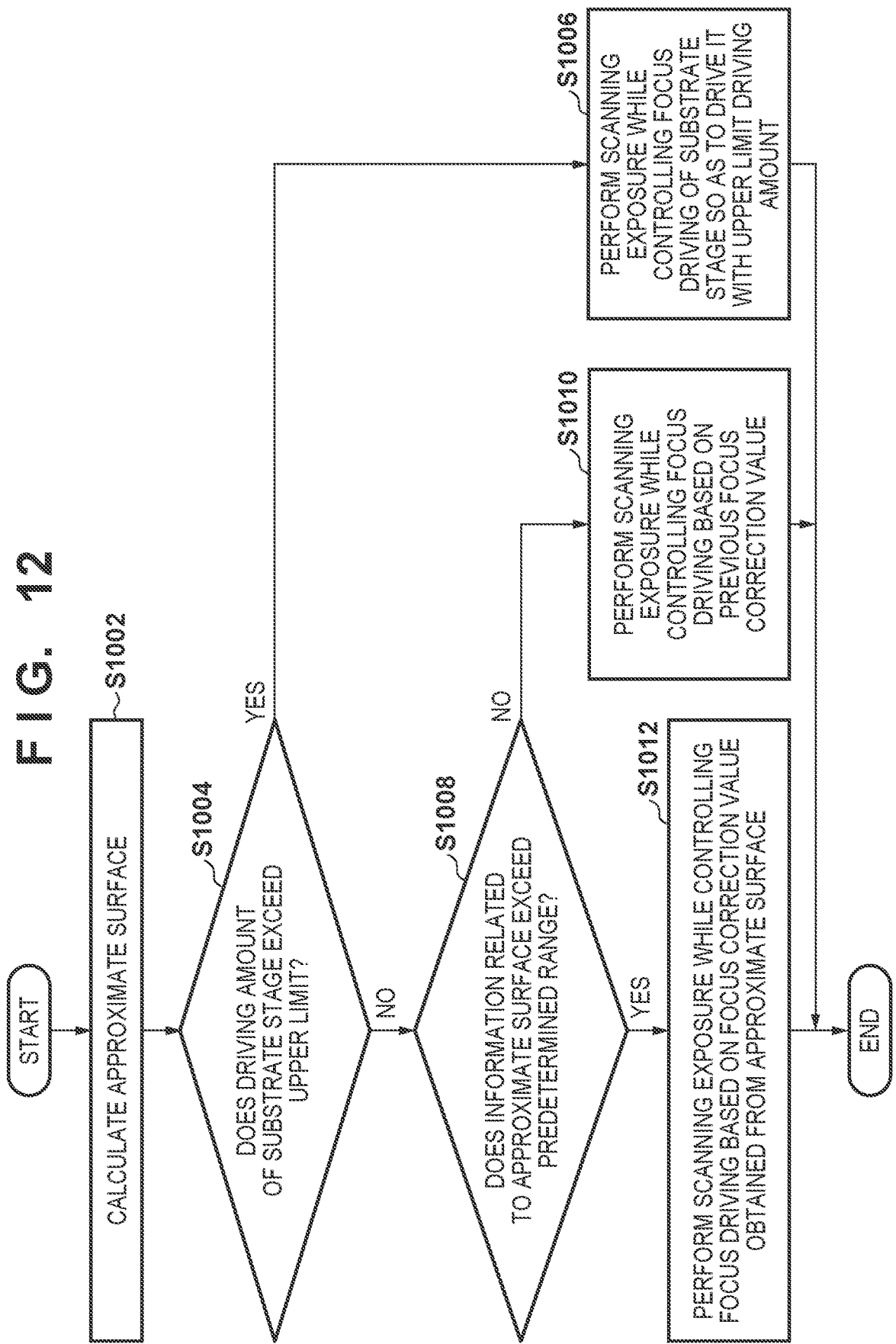

EXPOSURE APPARATUS, EXPOSURE METHOD, AND METHOD OF MANUFACTURING ARTICLE

BACKGROUND OF THE INVENTION

Field of the Invention

The present invention relates to an exposure apparatus, an exposure method, and a method of manufacturing an article.

Description of the Related Art

In a photolithography process of manufacturing a device such as a semiconductor device, an exposure apparatus that transfers the pattern of an original (reticle or mask) to a substrate via a projection optical system is used. As such an exposure apparatus, an exposure apparatus (stepper) employing a step-and-repeat method and an exposure apparatus (scanner) employing a step-and-scan method are generally known.

In order to accurately transfer the pattern of the original to the substrate, highly accurate focus alignment is required for the exposure apparatus in addition to alignment between the original and the substrate, and a technique related thereto has been proposed in Japanese Patent Laid-Open No. 2005-129674 and Japanese Patent Laid-Open No. 2016-100590. Note that focus alignment means alignment between the image plane of the projection optical system and the surface of the substrate.

Japanese Patent Laid-Open No. 2005-129674 discloses a technique of representing a processing target region (exposure region) on a substrate using a polynomial (approximate surface shape) based on the measurement results of the positions of the processing target region and performing feedforward processing of a focus correction value, thereby improving the focus followability (focus residual). Japanese Patent Laid-Open No. 2016-100590 discloses a technique of performing focus control using a focus correction value calculated from the measurement results of a plurality of positions on a substrate while removing an abnormal value therefrom.

However, there is a concern that if the focus correction value used for focus alignment varies for each exposure region, a residual related to driving control of a substrate stage (substrate) in the focus alignment, that is, a stage control residual is more likely to be generated.

SUMMARY OF THE INVENTION

The present invention provides a technique advantageous in suppressing a stage control residual.

According to one aspect of the present invention, there is provided an exposure apparatus for exposing a substrate via an original, including a substrate stage configured to hold the substrate, an obtainment unit configured to obtain, for each of a plurality of exposure regions to be exposed on the substrate, surface positions in a height direction at a plurality of measurement points in the exposure region, and a control unit configured to control, based on the surface positions obtained by the obtainment unit, driving of the substrate stage in the height direction when exposing each of the plurality of exposure regions, wherein the control unit obtains, for each of the plurality of exposure regions, an approximate surface approximately representing a cross-sectional shape of a surface of the exposure region from the surface positions obtained by the obtainment unit, and among the plurality of exposure regions, for a first exposure region for which information related to the approximate surface does not exceed a predetermined range, controls the driving based on a correction value related to the driving obtained from an approximate surface approximately representing a cross-sectional shape of a surface of the exposure region that has been exposed prior to the first exposure region.

Further aspects of the present invention will become apparent from the following description of exemplary embodiments with reference to the attached drawings.

BRIEF DESCRIPTION OF THE DRAWINGS

FIG. 4 is a view illustrating the measurement points in the shot region on the substrate and the measurement results of the surface positions at the respective measurement points.

FIGS. 8A and 8B are views each showing the positional relationship among a plurality of measurement points in partial shot region.

FIG. 9 is a view illustrating an example of a threshold set for an approximate surface of a partial shot region.

FIG. 11 is a view illustrating an example of the actual cross-sectional shape of the surface of an exposure region, the predicted cross-sectional shape thereof, and the threshold set for the approximate surface of the exposure region.

FIG. 12 is a flowchart for explaining an exposure process.

DESCRIPTION OF THE EMBODIMENTS

Figure 1:
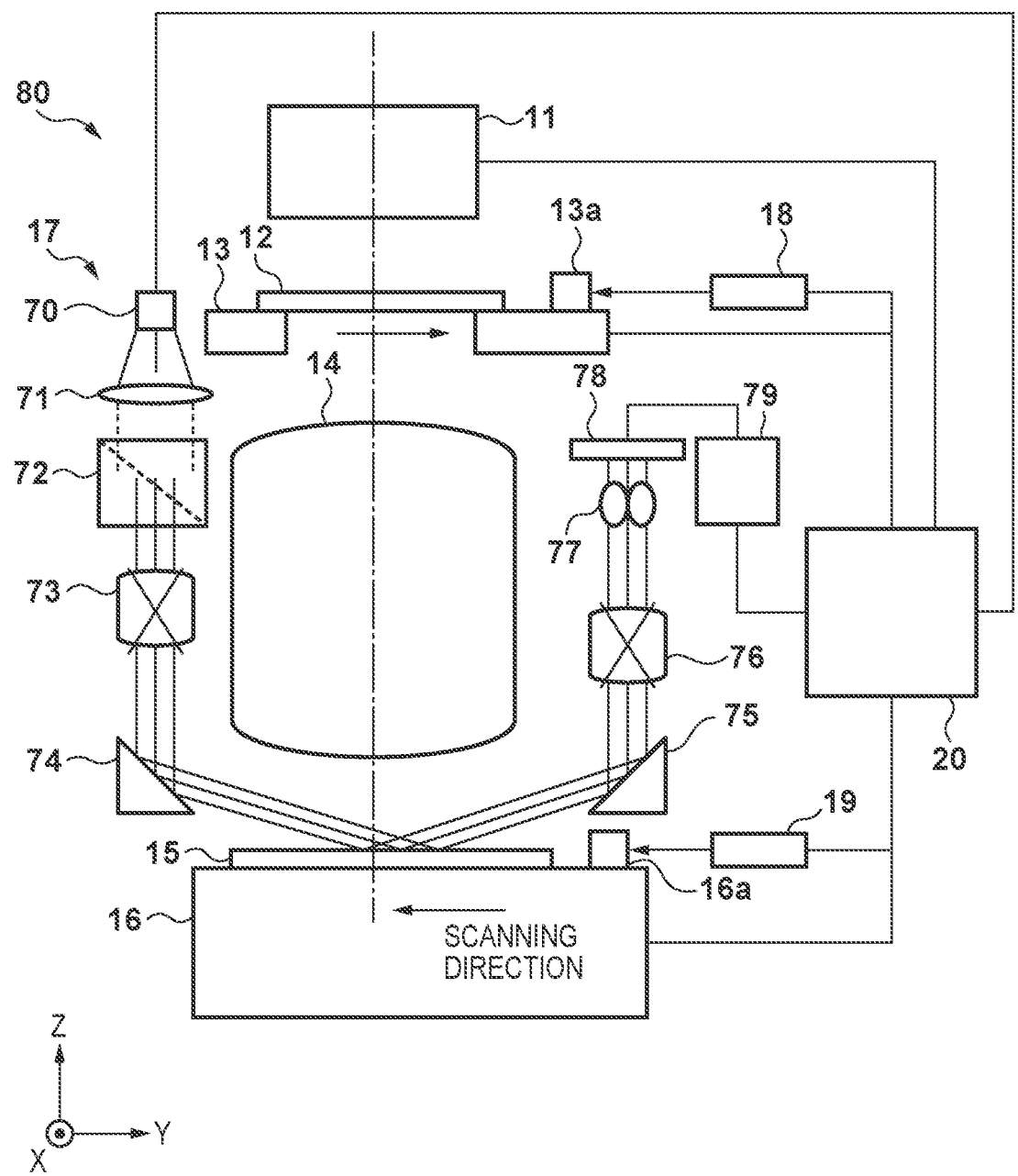
FIG. 1 is a schematic view illustrating a configuration of an exposure apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating a configuration of an exposure apparatus 80 according to an aspect of the present invention. The exposure apparatus 80 is a lithography apparatus that is used in a lithography process, which is a process of manufacturing a device such as a semiconductor device, and forms a pattern on a substrate using an original (a reticle or a mask). The exposure apparatus 80 performs an exposure process of exposing a substrate via an original to transfer the pattern of the original to the substrate.

In this embodiment, the exposure apparatus 80 is a step-and-scan exposure apparatus (scanner) that transfers the pattern of the original to the substrate by exposing the substrate while driving the original and the substrate in a scanning direction (scanning exposure). However, the exposure apparatus 80 can also employ a step-and-repeat method or another exposure method.

In the specification and the accompanying drawings, directions are indicated on an XYZ coordinate system in which a direction along the optical axis of a projection optical system 14 (to be described later) is defined as the Z-axis, and two directions parallel to a plane perpendicular to the Z-axis and perpendicular to each other are defined as the X-axis and the Y-axis. Directions parallel to the X-axis, the Y-axis, and the Z-axis of the XYZ coordinate system are referred to as the X direction, the Y direction, and the Z direction, respectively. A rotational direction around the X-axis, a rotational direction around the Y-axis, and a rotational direction around the Z-axis are referred to as the $\omega X$ direction, the $\omega Y$ direction, and the $\omega Z$ direction, respectively. In the following description, the Z direction is sometimes referred to as a height direction.

As shown in FIG. 1, the exposure apparatus 80 includes an illumination optical system 11, an original stage 13 that holds an original 12, a projection optical system 14, a substrate stage 16 that holds a substrate 15, a first measurement unit 18, a second measurement unit 19, a third measurement unit 17, and a control unit 20.

The control unit 20 is formed by, for example, a computer (information processing apparatus) including a CPU, a memory, and a like, and comprehensively controls the respective units of the exposure apparatus 80 in accordance with programs stored in a storage unit. In this embodiment, the control unit 20 controls an exposure process of transferring a pattern formed on the original 12 to the substrate 15 (performing scanning exposure of the substrate 15).

The illumination optical system 11 includes a light shielding member such as a masking blade. The illumination optical system 11 shapes light emitted from a light source (not shown) such as an excimer laser into, for example, band-like or arcuate slit-shaped light having a longitudinal direction in the X direction, and illuminates a portion of the original 12 with this slit-shaped light.

The original 12 and the substrate 15 are held by the original stage 13 and the substrate stage 16, respectively, and arranged in optically conjugate positions via the projection optical system 14.

The projection optical system 14 has a predetermined projection magnification (for example, ½ or ¼), and projects the pattern formed on the original 12 onto the substrate 15. In the following description, the region of the substrate 15 onto which the pattern of the original 12 is projected (that is, the region to be irradiated with the slit-shaped light and serving as a unit of exposure with respect to the shot region) is referred to as an exposure region 21.

The original stage 13 and the substrate stage 16 are configured to be capable of driving in a direction (for example, Y direction) perpendicular to the optical axis of the projection optical system 14 (the optical axis of the slit-shaped light). The original stage 13 and the substrate stage 16 are relatively driven (scanned) in synchronism with each other at a velocity ratio matching the projection magnification of the projection optical system 14. With this, it is possible to scan the exposure region 21 on the substrate and transfer the pattern of the original 12 to the substrate 15 (shot region). By sequentially repeating the scanning exposure as described above for each of a plurality of shot regions on the substrate, the exposure process for one substrate 15 is completed.

The first measurement unit 18 includes, for example, a laser interferometer, and measures the position of the original stage 13. For example, the laser interferometer included in the first measurement unit 18 emits a laser beam to a reflector 13a provided on the original stage 13 and detects the laser beam reflected by the reflector 13a, thereby measuring the displacement from the reference position on the original stage 13. The first measurement unit 18 can obtain the current position of the original stage 13 based on the displacement from the reference position on the original stage 13.

The second measurement unit 19 includes, for example, a laser interferometer, and measures the position of the substrate stage 16. For example, the laser interferometer included in the second measurement unit 19 emits a laser beam to a reflector 16a provided on the substrate stage 16 and detects the laser beam reflected by the reflector 16a, thereby measuring the displacement from the reference position on the substrate stage 16. The second measurement unit 19 can obtain the current position of the substrate stage 16 based on the displacement from the reference position on the substrate stage 16.

Based on the current position of the original stage 13 obtained by the first measurement unit 18 and the current position of the substrate stage 16 obtained by the second measurement unit 19, the control unit 20 controls driving of the original stage 13 and driving of the substrate stage 16 in the X direction and the Y direction. Note that in this embodiment, the first measurement unit 18 and the second measurement unit 19 use the laser interferometers to measure the position of the original stage 13 and the position of the substrate stage 16, respectively, but the present invention is not limited to this. For example, an encoder may be used.

The third measurement unit 17 is used to match the surface (to be referred to as the "substrate surface" hereinafter) of the substrate 15 with the image plane of the projection optical system 14, and has a function of measuring the position and tilt of the substrate surface. In this embodiment, the third measurement unit 17 measures the surface position (the position in the height direction) of a measurement target point (measurement point) in the shot region on the substrate 15 held by the substrate stage 16 while the substrate stage 16 is driven. In this manner, the third measurement unit 17 functions as an obtainment unit that obtains the surface positions in the height direction at a plurality of measurement points in the exposure region to be exposed on the substrate 15.

The third measurement unit 17 is configured as, for example, an oblique incident measurement unit that obliquely irradiates the substrate 15 with light. The third measurement unit 17 includes an irradiation system 17a that irradiates the substrate 15 with light, and a light receiving system 17b that receives the light reflected by the substrate 15.

The irradiation system 17a includes, for example, a light source 70, a collimator lens 71, a slit member 72, an irradiation optical system 73, and a mirror 74. The light receiving system 17b includes, for example, a mirror 75, a light receiving optical system 76, a correction optical system 77, a photoelectric conversion element 78, and a processing unit 79.

The light source 70 includes a lamp, a light emitting diode, or the like, and emits light of a wavelength to which the resist agent (photosensitive agent) on the substrate is not sensitive. The collimator lens 71 converts the light emitted from the light source 70 into parallel light whose section has an almost uniform intensity distribution. The slit member 72 is constructed by bonding a pair of prisms (prism-shaped members) so that their inclined surfaces face each other. A plurality of openings (for example, nine pinholes) are formed in the bonded surface by using a light shielding film made of chrome or the like. The irradiation optical system 73 is a bi-telecentric system, and causes (guides) the light beams having passed through the plurality of openings of the slit member 72 to enter the plurality of measurement target points (measurement points), respectively, in the shot region on the substrate 15 via the mirror 74.

Figure 2:
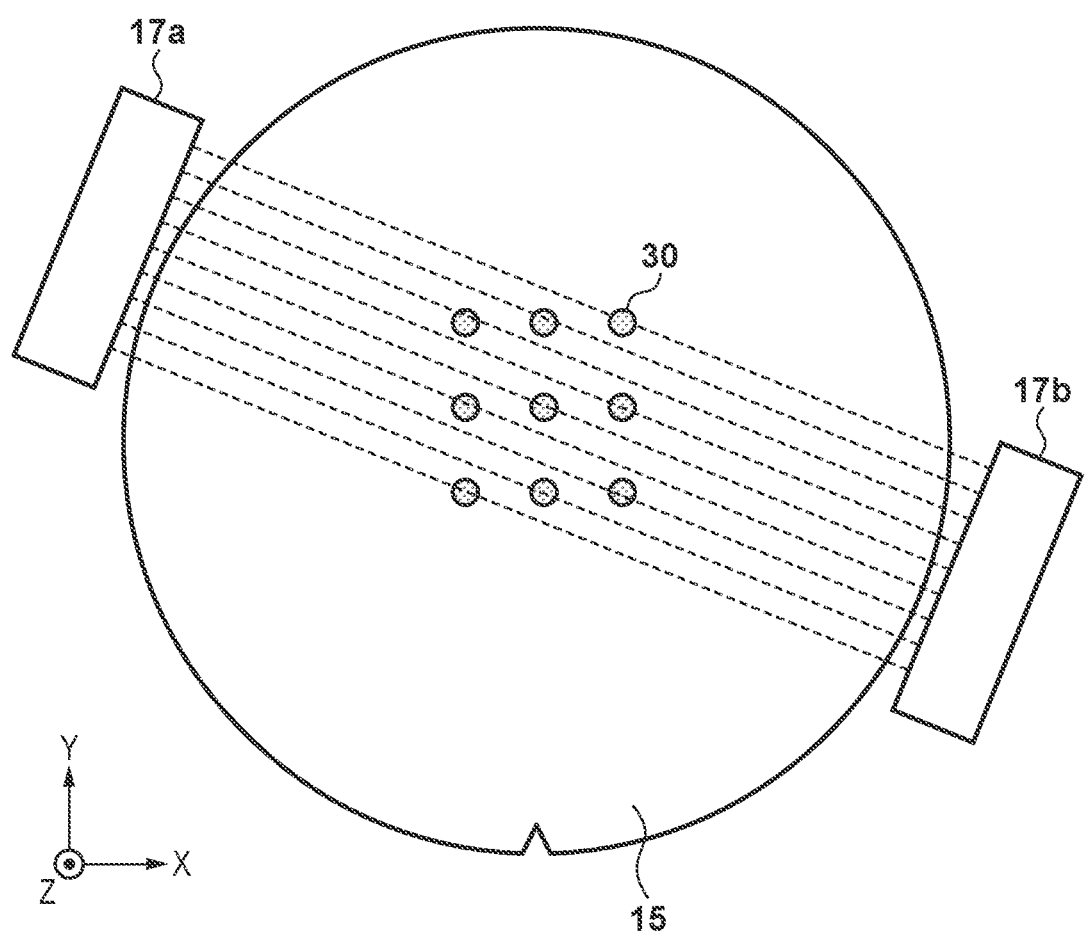
FIG. 2 is a view illustrating an example of the relationship among an irradiation system, a light receiving system, and measurement points on a substrate.

A plane (bonded surface) with the openings formed therein and the substrate surface are set to satisfy a shine proof condition with respect to the irradiation optical system 73. In this embodiment, the incident angle (the angle defined by the optical axis of the projection optical system 14) of the light entering the substrate 15 from the irradiation optical system 73 is 70° or more. Further, as shown in FIG. 2, the irradiation system 17a is configured to emit light from a direction having an angle θ (for example, 22.5°) with respect to the scanning direction (Y direction) in directions (X and Y directions) parallel to the substrate surface. In this manner, by causing a plurality of (for example, nine) light beams to enter a plurality of (for example, nine) measurement target points on the substrate, that is, measurement points 30, the surface positions of the substrate surface can be measured independently (individually) at the plurality of measurement points 30. FIG. 2 shows an example of the relationship among the irradiation system 17a, the light receiving system 17b, and the measurement points 30 on the substrate.

The plurality of light beams reflected by the respective measurement target points (measurement points 30) on the substrate enter the light receiving optical system 76 via the mirror 75. The light receiving optical system 76 is a bi-telecentric system. The light receiving optical system 76 includes a common diaphragm for the plurality of light beams reflected by the respective measurement target points on the substrate. The diaphragm cuts off high-order diffracted light (noise light) generated by the pattern formed on the substrate.

The correction optical system 77 includes a plurality of (for example, nine) correction lenses, and forms the plurality of light beams having passed through the light receiving optical system 76 into images on the photoelectric conversion surface (light receiving surface) of the photoelectric conversion element 78, thereby forming a plurality of pinhole images on the photoelectric conversion surface. For example, a CCD line sensor, a CMOS line sensor, or the like is used as the photoelectric conversion element 78. Based on the position of each pinhole image formed on the photoelectric conversion element 78 (photoelectric conversion surface thereof), the processing unit 79 calculates (obtains) the surface position of the substrate surface at each measurement target point, that is, the measurement point 30 on the substrate. Note that the light receiving system 17b performs inclination correction so that the respective measurement points on the substrate and the photoelectric conversion surface of the photoelectric conversion element 78 become conjugate to each other. Therefore, the position of each pinhole image formed on the photoelectric conversion surface of the photoelectric conversion element 78 does not change due to a local tilt of each measurement point on the substrate.

By configuring the irradiation system 17a and the light receiving system 17b as described above, the third measurement unit 17 can measure the surface position of the substrate surface at each measurement point on the substrate based on the position of each pinhole image formed on the photoelectric conversion surface of the photoelectric conversion element 78. Then, based on the measurement result of the third measurement unit 17, the control unit 20 controls driving (focus driving) of the substrate stage 16 in the Z direction so as to match the substrate surface of the substrate 15 with the target surface (target height position). Here, the target surface is the image plane of the pattern of the original 12, that is, the position (best focus position (optimum exposure position)) of the image plane of the projection optical system 14. However, the target surface does not mean a position that completely matches the position of the image plane of the projection optical system 14 but includes a position within the range of an allowable depth of focus.

Figure 3:
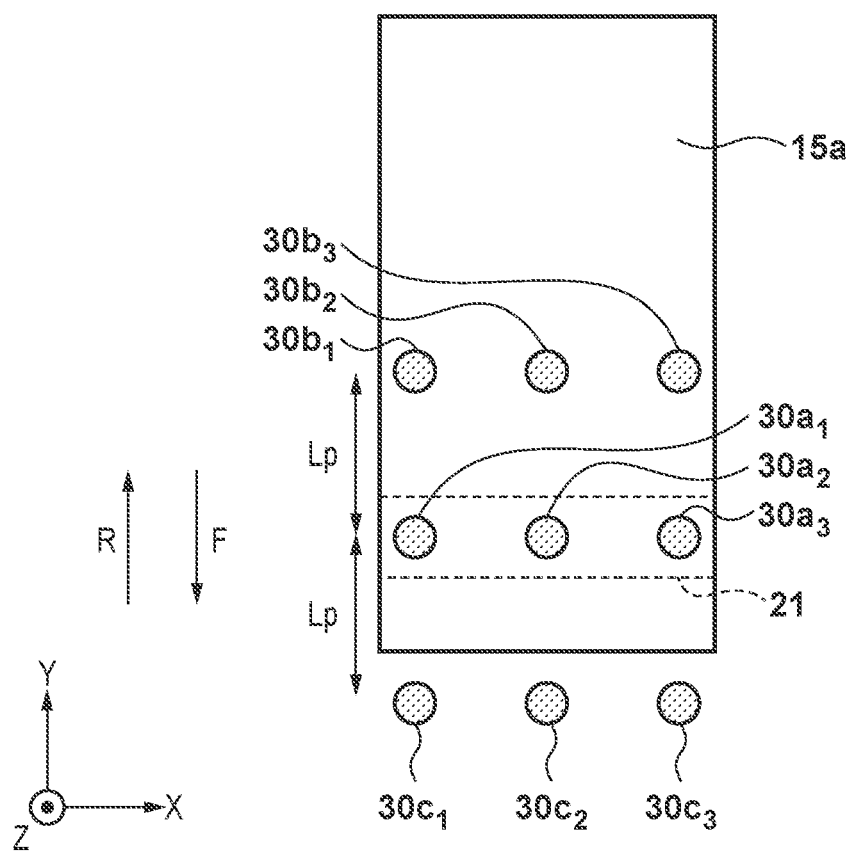
FIG. 3 is a view illustrating the relationship between an exposure region and the measurement points formed in a shot region on the substrate.

FIG. 3 is a view illustrating the relationship among the exposure region 21 and nine measurement points 30 ($30a_1$ to $30a_3$, $30b_1$ to $30b_3$, and $30c_1$ to $30c_3$) formed in a shot region 15a on the substrate by the third measurement unit 17. The exposure region 21 is a region having a rectangular shape indicated by dashed lines in FIG. 3. The measurement points $30a_1$ to $30a_3$ are the measurement points formed in (inside) the exposure region 21. The measurement points $30a_1$ to $30a_3$ are the measurement points where measurement of the surface positions of the substrate surface at the measurement target points, so-called focus measurement, is performed in parallel with exposure of the measurement target points on the substrate. The measurement points $30b_1$ to $30b_3$ and $30c_1$ to $30c_3$ are the measurement points formed at positions away from the measurement points $30a_1$ to $30a_3$, respectively, formed in the exposure region 21 by a distance Lp in the scanning direction (Y direction). The measurement points $30b_1$ to $30b_3$ and $30c_1$ to $30c_3$ are the measurement points where measurement of the surface positions of the substrate surface at the measurement target points, so-called focus measurement, is performed prior to exposure of the measurement target points on the substrate.

In accordance with the driving direction (scanning direction) of the substrate stage 16, the control unit 20 switches the measurement points used for measurement of the surface positions at the measurement target points on the substrate, that is, focus measurement. For example, with reference to FIG. 3, when scanning exposure is performed while driving the substrate stage 16 in the direction indicated by an arrow F, focus measurement at the measurement points $30b_1$ to $30b_3$ is performed prior to focus measurement at the measurement points $30a_1$ to $30a_3$ formed in the exposure region 21. At this time, based on the results of the focus measurement at the measurement points $30b_1$ to $30b_3$, the control unit 20 decides a command value for arranging the surface position of the region including the measurement points $30b_1$ to $30b_3$ at the target height position. Then, in accordance with the decided command value, the control unit 20 controls focus driving of the substrate stage 16 such that the region including the measurement points $30b_1$ to $30b_3$ is arranged at the target height position by the time the region becomes the exposure region 21 (reaches the exposure region 21).

On the other hand, when scanning exposure is performed while driving the substrate stage 16 in the direction indicated by an arrow R, focus measurement at the measurement points $30c_1$ to $30c_3$ is performed prior to focus measurement at the measurement points $30a_1$ to $30a_3$ formed in the exposure region 21. At this time, based on the results of the focus measurement at the measurement points $30c_1$ to $30c_3$, the control unit 20 decides a command value for arranging the surface position of the region including the measurement points $30c_1$ to $30c_3$ at the target height position. Then, in accordance with the decided command value, the control unit 20 controls focus driving of the substrate stage 16 such that the region including the measurement points $30c_1$ to $30c_3$ is arranged at the target height position by the time the region becomes the exposure region 21.

Here, with reference to FIG. 4, a method for improving the synchronization accuracy of the substrate stage 16 when performing scanning exposure while driving the substrate stage 16 in the direction indicated by the arrow F is described. FIG. 4 is a view illustrating the measurement points $30c_1$ to $30c_3$ in the shot region 15a on the substrate, and measurement results (focus measurement results) z1 to z3 of the surface positions at the respective measurement points. In the related art, the control unit 20 calculates, from the measurement results z1 to z3 of the surface positions at the respective measurement points $30c_1$ to $30c_3$, the approximate surface that approximately represents the cross-sectional shape of the surface of the exposure region 21. Then, based on the tilt of the approximate surface (the ωX-direction rotation and ωY-direction rotation of the substrate stage) and the focus measurement results, the control unit 20 controls focus driving of the substrate stage 16 as described above. Note that in order to avoid degradation in synchronization accuracy due to rapid driving of the substrate stage 16, the upper limit of the driving amount (upper limit driving amount) is generally set for the driving amount of the substrate stage 16. Accordingly, during focus driving, if the driving amount of the substrate stage 16 exceeds the upper limit, the substrate stage 16 is driven with the upper limit driving amount.

A technique for suppressing the residual related to driving control of the substrate stage 16, that is, the stage control residual during focus driving is described below in each embodiment. Note that the stage control residual is one of factors of the focus residual.

First Embodiment

Figure 5A:
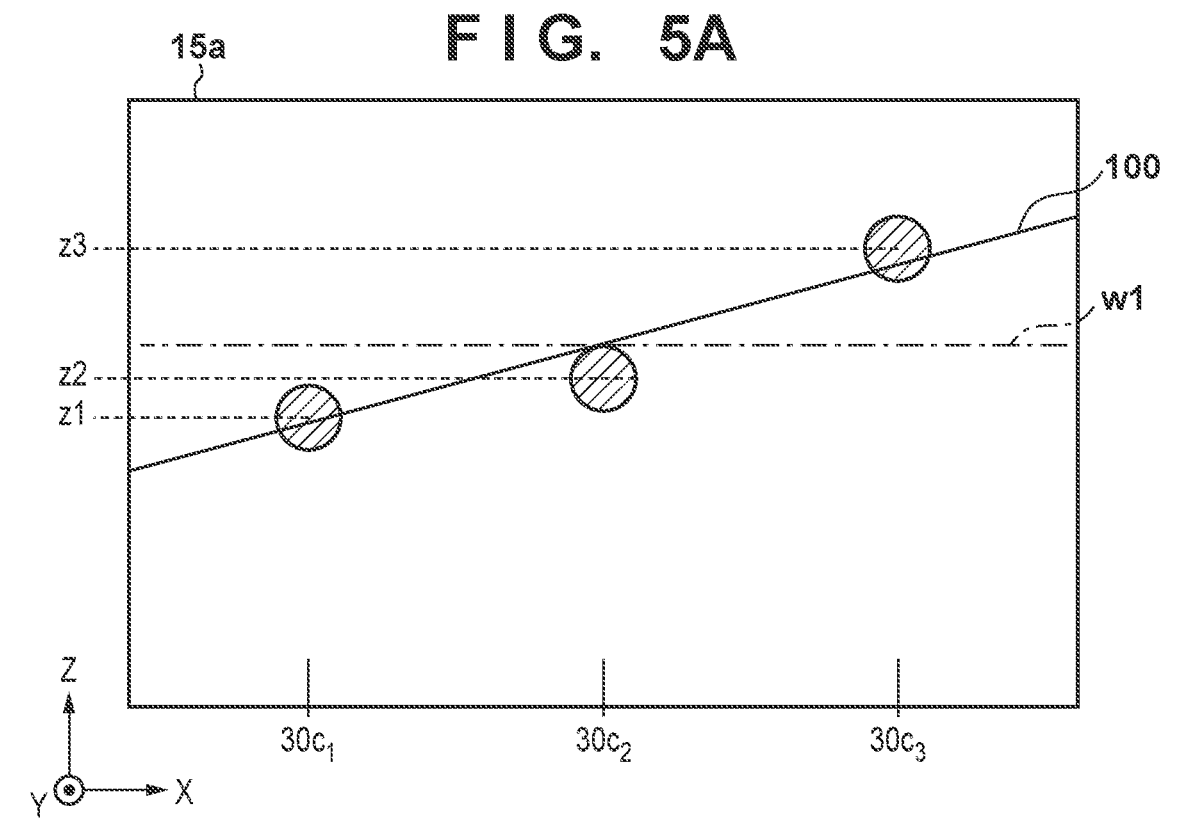
FIGS. 5A and 5B are views each showing an example of the measurement results of the surface positions at the respective measurement points.
Figure 5B:
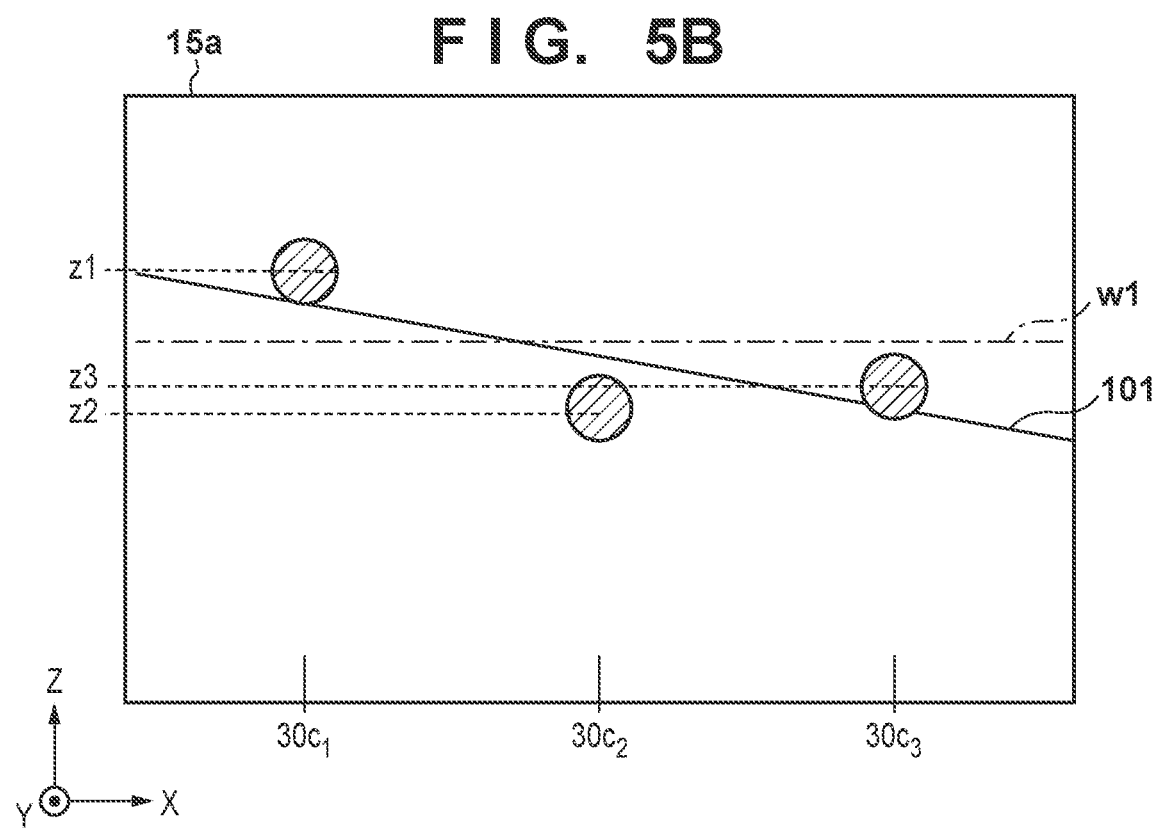

As shown in FIG. 4, if a cross-sectional shape w1 of the surface of a substrate 15 is a plane, the same approximate surface as the cross-sectional shape w1 of the surface of the substrate 15 is ideally calculated. Hence, focus driving of a substrate stage 16 is controlled such that the substrate stage 16 becomes a planar surface. However, in practice, measurement results z1 to z3 at measurement points $30c_1$ to $30c_3$ include measurement errors s1 to s3, respectively, as shown in FIG. 4. Therefore, even if the cross-sectional shape w1 of the surface of the substrate 15 is a plane, the measurement results z1 to z3 at the respective measurement points $30c_1$ to $30c_3$ vary as shown in FIGS. 5A and 5B. FIGS. 5A and 5B are views each showing an example of the measurement results z1 to z3 at the respective measurement points $30c_1$ to $30c_3$ including measurement errors. Even if the cross-sectional shape w1 of the surface of the substrate 15 has the same planar shape, an approximate surface 100 is calculated from the measurement results z1 to z3 shown in FIG. 5A, and an approximate surface 101 is calculated from the measurement results z1 to z3 shown in FIG. 5B. In this manner, if the approximate surface calculated from the measurement results at the respective measurement points varies for each exposure region due to the measurement errors, the correction value (focus correction value) related to focus driving obtained from the approximate surface also varies. As a result, an unnecessary disturbance is given to driving control of the substrate stage 16, and a stage control residual is generated (the synchronization accuracy of the substrate stage 16 decreases).

To prevent this, in this embodiment, for the approximate surface (focus correction value obtained therefrom) calculated from the measurement results of the surface positions at the respective measurement points on the substrate, a specific threshold range (predetermined range) is set. Then, the approximate surface is compared with the specific threshold range to determine whether to apply the focus correction value obtained from the approximate surface to focus driving.

Figure 6:
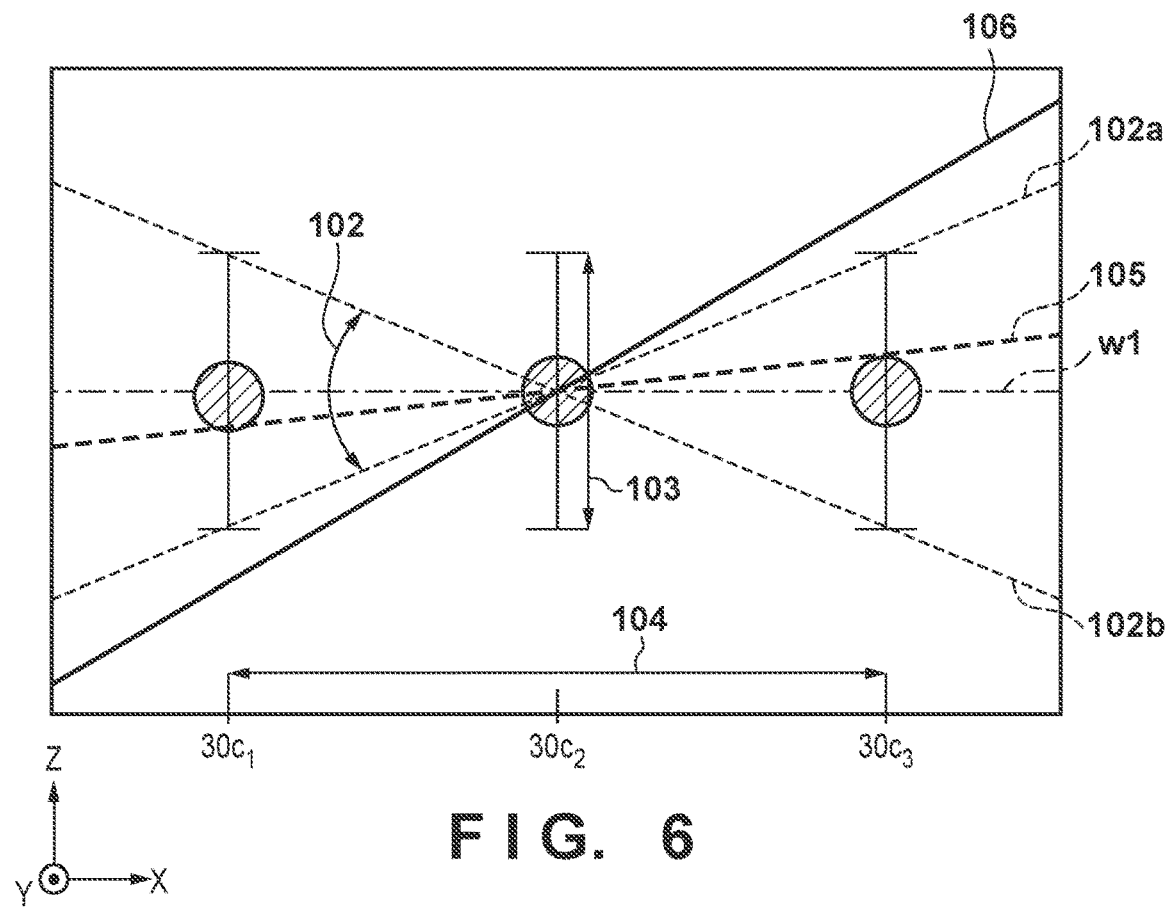
FIG. 6 is a view illustrating an example of a threshold set for an approximate surface.

FIG. 6 is a view illustrating an example of a threshold 102 (range thereof) set for the tilt (the rotation in the ωY direction in this embodiment) of an approximate surface 105 calculated from the measurement results at the measurement points $30c_1$ to $30c_3$. In this embodiment, the threshold 102 is set (specified) based on a measurement accuracy 103 of a third measurement unit 17 with respect to the measurement points $30c_1$ to $30c_3$ and a measurement span 104 (measurement range) of a third measurement unit 17 with respect to the measurement points $30c_1$ to $30c_3$. More specifically, as shown in FIG. 6, the threshold 102 (range thereof) is specified by the range sandwiched between two lines 102a and 102b. The line 102a is a line connecting, of the measurement points $30c_1$ and $30c_3$ located at both ends of the measurement span 104, the lower limit value of the measurement accuracy 103 at one measurement point $30c_1$ and the upper limit value of the measurement accuracy 103 at the other measurement point $30c_3$. The line 102b is a line connecting, of the measurement points $30c_1$ and $30c_3$ located at both ends of the measurement span 104, the upper limit value of the measurement accuracy 103 at one measurement point $30c_1$ and the lower limit value of the measurement accuracy 103 at the other measurement point $30c_3$. For the measurement accuracy 103, the standard deviation of the measurement results of the surface positions at the respective measurement points obtained by the third measurement unit 17, which are evaluated in advance, may be used, or different values may be used at the respective measurement points serving as the measurement units (channels). The measurement span 104 is decided based on, among the plurality of measurement points formed by the third measurement unit 17, the measurement points (valid channels) at which the surface positions can be measured. Therefore, for example, for a partial shot region, the measurement span 104 is decided while excluding the measurement point (invalid channel) not existing on the substrate.

With reference to FIG. 6, in this embodiment, if an approximate surface 105 whose tilt falls within the range of the threshold 102 is calculated, focus driving of the substrate stage 16 is controlled by the control unit 20 without applying the focus correction value obtained from the approximate surface 105. More specifically, focus driving of the substrate stage 16 is controlled based on the focus correction value obtained from the approximate surface approximately representing the cross-sectional shape of the surface of the exposure region that has been exposed prior to the exposure region to be exposed. For example, focus driving of the substrate stage 16 is controlled while taking over the focus correction value that has been applied when exposing the exposure region that has been exposed immediately before the exposure region to be exposed. On the other hand, if an approximate surface 106 whose tilt falls outside the range of the threshold 102 is calculated, focus driving of the substrate stage 16 is controlled by the control unit 20 based on the focus correction value obtained from the approximate surface 106.

In this embodiment, for the exposure region (first exposure region) for which the tilt of the approximate surface does not exceed the range of the threshold 102, focus driving of the substrate stage 16 is controlled based on the focus correction value obtained from the approximate surface of the exposure region that has been exposed prior to this exposure region. With this, in focus driving, unnecessary driving control of the substrate stage 16 caused by the measurement accuracy of the third measurement unit 17 can be reduced, so that generation of a stage control residual can be suppressed (the synchronization error of the substrate stage 16 can be reduced).

On the other hand, for the exposure region (second exposure region) for which the tilt of the approximate surface exceeds the range of the threshold 102, focus driving of the substrate stage 16 is controlled based on the focus correction value obtained from the approximate surface of this exposure region. Accordingly, if the approximate surface of the exposure region largely varies, focus driving of the substrate stage 16 can be controlled with high accuracy in accordance with the cross-sectional shape of the surface of the exposure region. Thus, generation of a focus residual can be suppressed.

For the exposure region (third exposure region) to exposed first, no focus correction value has been obtained prior to this exposure region. Therefore, for the exposure region to be exposed first, regardless of whether the tilt of the approximate surface falls within or outside the range of the threshold 102, focus driving of the substrate stage 16 is controlled based on the focus correction value obtained from the approximate surface of this exposure region.

In this embodiment, the tilt (the rotation in the ωY direction) of the approximate surface has been taken as an example and described, but it is also possible to similarly control focus driving regarding the tilt (the rotation in the ωX direction) of the approximate surface. Alternatively, a predetermined range may be set with respect to the position of the approximate surface in the height direction and, if the position of the approximate surface in the height direction exceeds the predetermined range, focus driving of the substrate stage 16 may be controlled based on the correction value related to focus driving obtained from the approximate surface. If the position of the approximate surface in the height direction does not exceed the predetermined range, focus driving of the substrate stage 16 may be controlled based on, for example, the correction value related to focus driving that has been applied when exposing the immediately precedingly exposed exposure region.

That is, if the information related to the approximate surface exceeds the predetermine range, focus driving of the substrate stage 16 is controlled based on the focus correction value related to focus driving obtained from the approximate surface. If the information related to the approximate surface does not exceed the predetermined range, focus driving is controlled based on, for example, the focus correction value that has been applied when exposing the immediately precedingly exposed exposure region. Here, the information related to the approximate surface includes at least one of the tilt of the approximate surface and the position of the approximate surface in the height direction.

Second Embodiment

Figure 7:
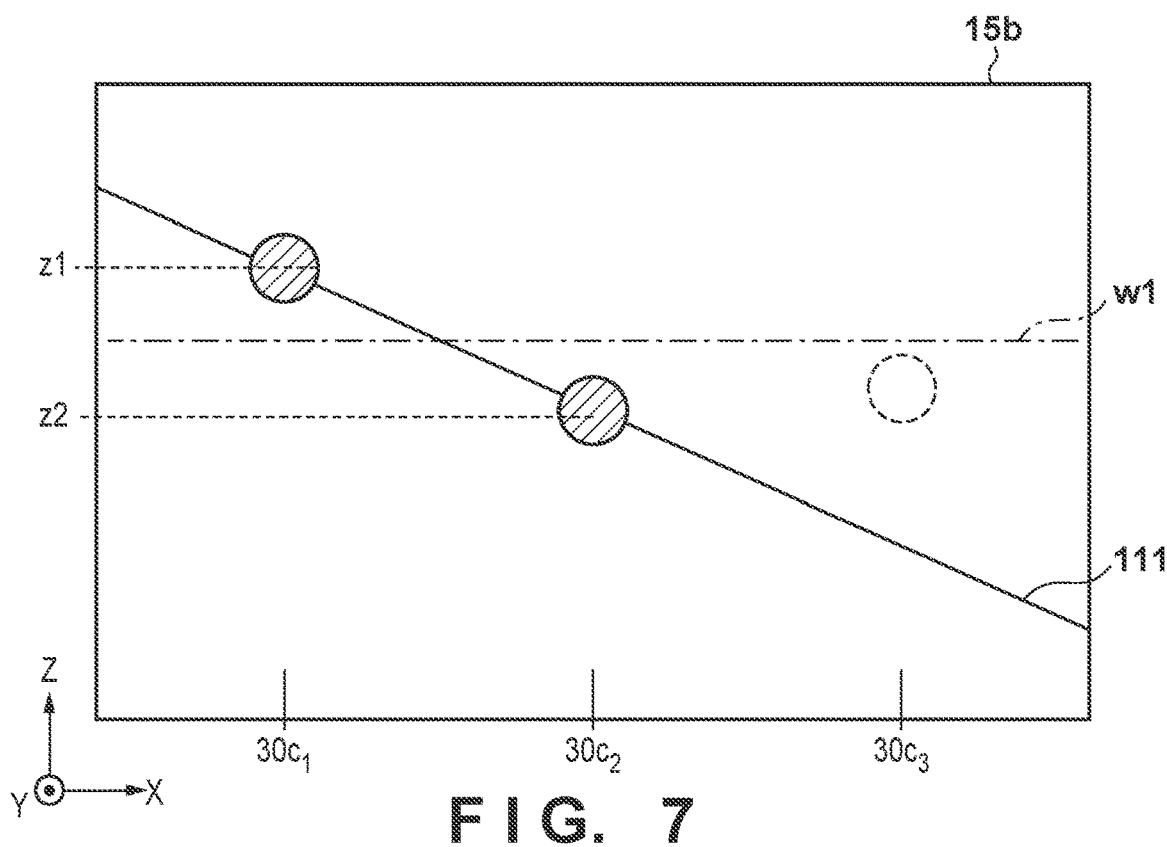
FIG. 7 is a view illustrating measurement points in a partial shot region on the substrate, and the measurement results of the surface positions at the respective measurement points.

In this embodiment, a technique of reducing a stage control residual (focus residual) in, among shot regions on a substrate 15, a partial shot region including an outer peripheral portion of the substrate 15 is described. FIG. 7 is a view illustrating measurement points $30c_1$ to $30c_3$ in a partial shot region 15b including the outer peripheral portion of the substrate 15, and measurement results (focus measurement results) z1 and z2 of the surface positions at the measurement points $30c_1$ and $30c_2$. With reference to FIG. 7, in the partial shot region 15b, since the measurement point $30c_3$ is the measurement point (invalid channel) not existing on the substrate, a third measurement unit 17 cannot measure the surface position at the measurement point $30c_3$. As a result, the measurement span of the third measurement unit 17 decreases, and the accuracy of an approximate surface 111 approximately representing the cross-sectional shape of the surface of the exposure region including the measurement points $30c_1$ and $30c_2$ decreases.

FIG. 8A is a view showing the relationship among a plurality of measurement points $30c_1$ to $30c_6$ formed, by the third measurement unit 17, in a partial shot region 15c including the outer peripheral portion of the substrate 15, and FIG. 8B is a view showing the relationship among the plurality of measurement points $30c_1$ to $30c_6$ formed, by the third measurement unit 17, in a partial shot region 15d including the outer peripheral portion of the substrate 15. The measurement points $30c_1$ to $30c_6$ are formed so as to be arranged in the X direction.

With reference to FIG. 8A, in the partial shot region 15c, the measurement points $30c_1$ to $30c_4$ are valid channels, and the measurement points $30c_5$ and $30c_6$ are invalid channels. With reference to FIG. 8B, in the partial shot region 15d, the measurement points $30c_1$ and $30c_2$ are valid channels, and the measurement points $30c_3$ to $30c_6$ are invalid channels. In this manner, the measurement span of the third measurement unit 17 changes in accordance with the number of valid channels, and the accuracy of the approximate surface also changes accordingly.

In this embodiment, the threshold set for the approximate surface is optimized for each exposure region. With this, it becomes possible to control focus driving of a substrate stage 16 with high accuracy even for a partial shot region including the outer peripheral portion of the substrate 15.

FIG. 9 is a view illustrating an example of a threshold 112 set for an approximate surface 111 of a partial shot region including the outer peripheral portion of the substrate 15. With reference to FIG. 9, a measurement accuracy 103 of the third measurement unit 17 is unchanged, but a measurement spa 113 of the third measurement unit 17 is decreased. Therefore, the region of the threshold 112 set for the approximate surface 111 of the partial shot region, that is, the region sandwiched between two lines 112a and 112b becomes larger than the range of the threshold 102 set for the approximate surface 105 of a normal shot region (see FIG. 6).

If the approximate surface 111 whose tilt falls within the range of the threshold 112 is calculated, focus driving of the substrate stage 16 is controlled by a control unit 20 without applying the focus control value obtained from the approximate surface 111, as in the first embodiment. On the other hand, if an approximate surface 114 whose tilt falls outside the range of the threshold 112 is calculated, focus driving of the substrate stage 16 is controlled by the control unit 20 based on the focus control value obtained from the approximate surface 114.

Figure 10A:
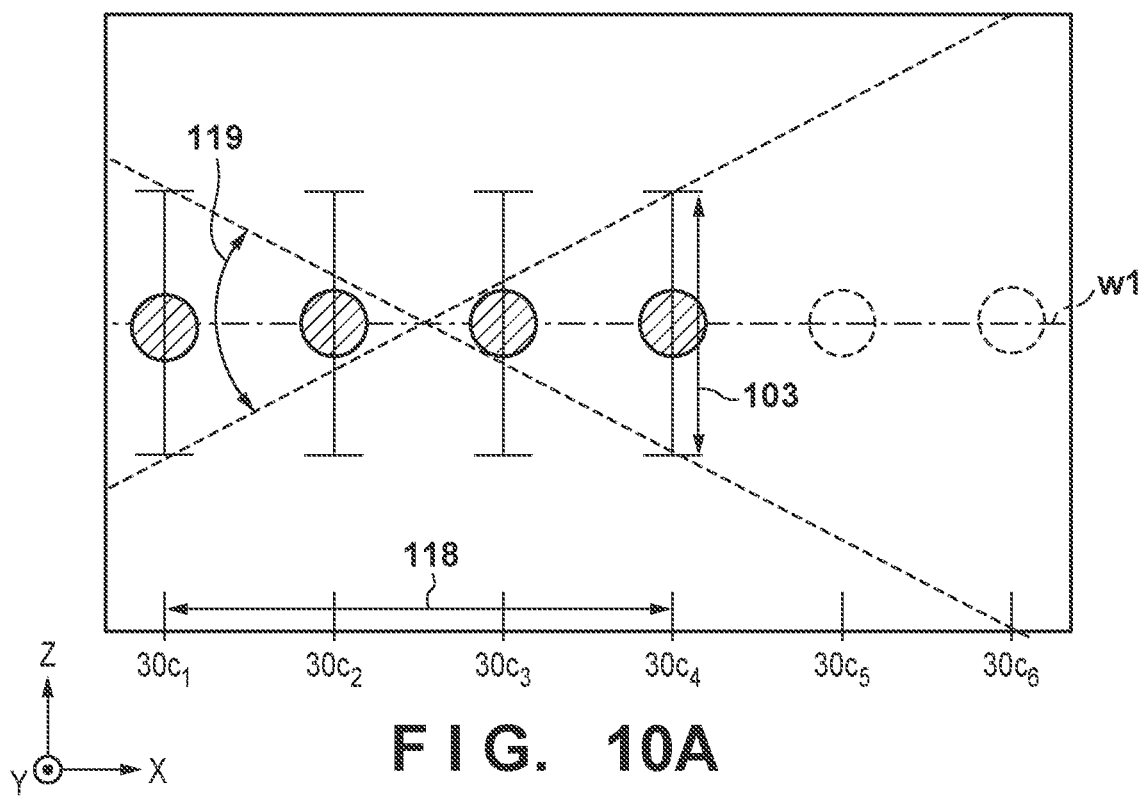
FIGS. 10A and 10B are views each showing an example of the threshold set for the approximate surface of a partial shot region.
Figure 10B:
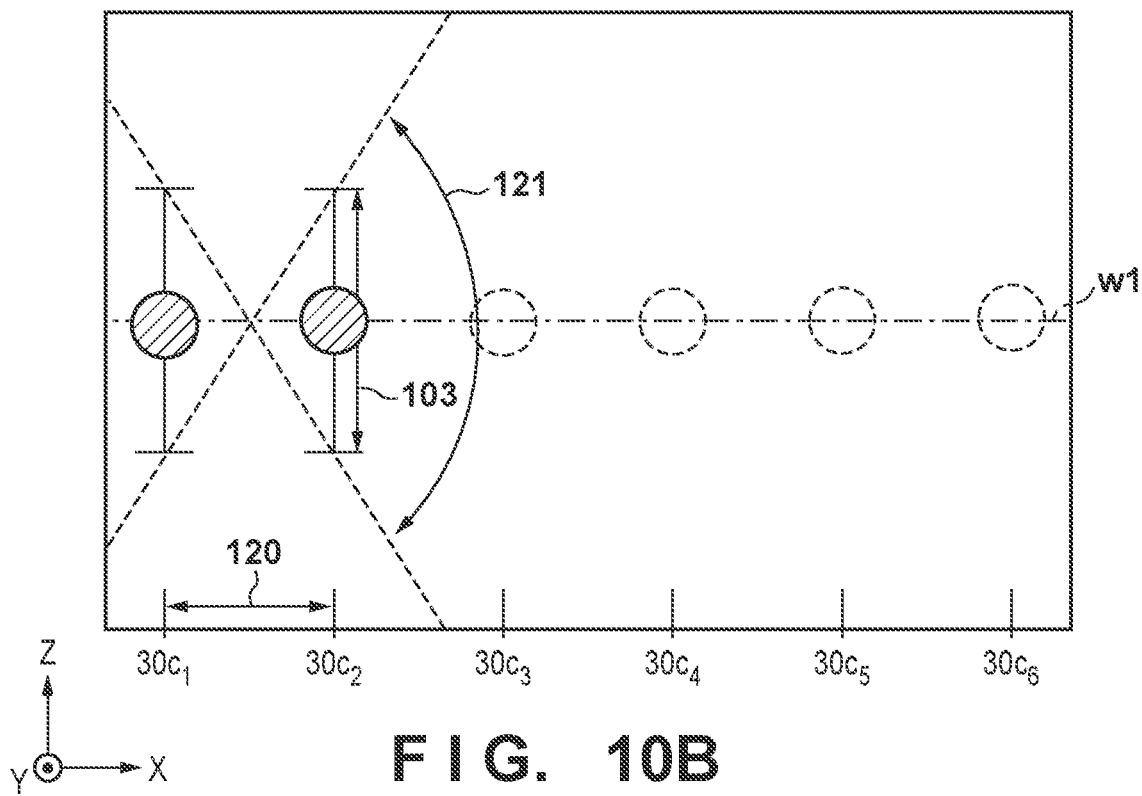

FIGS. 10A and 10B are views each showing an example of the threshold set for the approximate surface of the partial shot region when the third measurement unit 17 forms the plurality of measurement point $30c_1$ to $30c_6$ in the X direction. With reference to FIG. 10A, a measurement span 118 of the third measurement unit 17 is decided from the measurement points $30c_1$ to $30c_4$ serving as the valid channels among the measurement points $30c_1$ to $30c_6$. Then, based on the measurement accuracy 103 of the third measurement unit 17 and the measurement span 118 of the third measurement unit 17, a threshold 119 is set. With reference to FIG. 10B, a measurement span 120 of the third measurement unit 17 is decided from the measurement point $30c_1$ and $30c_2$ serving as the valid channels among the measurement points $30c_1$ to $30c_6$. Based on the measurement accuracy 103 of the third measurement unit 17 and the measurement span 120 of the third measurement unit 17, a threshold 121 is set.

According to this embodiment, for the partial shot region including the outer peripheral portion of the substrate 15, it is also possible to control focus driving of the substrate stage 16 with high accuracy. Thus, generation of a stage control residual can be suppressed.

Third Embodiment

In this embodiment, a control unit 20 predicts the cross-sectional shape of the surface of an exposure region based on the measurement result of the surface position of a shot region on a substrate 15 and the measurement result of the surface position of an adjacent shot region, and obtains a predicted cross-sectional shape w3 with respect to an actual cross-sectional shape w2 of the surface of the exposure region. Note that the predicted cross-sectional shape w3 is obtained by performing function approximation, for example, three-dimensional function approximation.

FIG. 11 is a view illustrating an example of the actual cross-sectional shape w2 of the surface of an exposure region, the predicted cross-sectional shape w3 of the surface of the exposure region, and the threshold set for the approximate surface of the exposure region. With reference to FIG. 11, in this embodiment, a threshold 115 is set based on a measurement accuracy 103 of a third measurement unit 17, a measurement span 104 of the third measurement unit 17, and the predicted cross-sectional shape w3. More specifically, the threshold 115 is set from the measurement accuracy 103 and measurement span 104 of the third measurement unit 17 with the predicted cross-sectional shape w3 as a reference. Accordingly, the range of the threshold 115, that is, the range sandwiched between two lines 115a and 115b is shifted with respect to the range of the threshold 102 (see FIG. 6).

If an approximate surface 116 whose tilt falls within the range of the threshold 115 is calculated, focus driving of a substrate stage 16 is controlled by the control unit 20 based on the focus correction value obtained from the predicted cross-sectional shape w3 without applying the focus correction value obtained from the approximate surface 116. On the other hand, if an approximate surface 117 whose tilt falls outside the range of the threshold 115 is calculated, focus driving of the substrate stage 16 is controlled by the control unit 20 based on the focus correction value obtained from the approximate surface 117.

According to this embodiment, since focus driving of the substrate stage 16 can be controlled with high accuracy, generation of a stage control residual can be suppressed. This embodiment is advantageous particularly when a change of the cross-sectional shape of the surface of the substrate 15 is buried in a variation of the approximate surface caused by the measurement accuracy of the third measurement unit 17.

Fourth Embodiment

With reference to FIG. 12, an exposure process (exposure method) in an exposure apparatus 80 is described. FIG. 12 is a flowchart for explaining the exposure process in this embodiment.

In step S1002, based on the results of focus measurement at respective measurement points on a substrate 15, a control unit 20 calculates the approximate surface approximately representing the cross-sectional shape of the surface of the exposure region including the respective measurement points.

In step S1004, based on the focus correction value obtained from the approximate surface calculated in step S1002, the control unit 20 determines whether the driving amount of a substrate stage 16 in focus driving exceeds the upper limit. If the driving amount of the substrate stage 16 in focus driving exceeds the upper limit, the process shifts to step S1006. On the other hand, if the driving amount of the substrate stage 16 in focus driving does not exceed the upper limit, the process shifts to step S1008.

In step S1006, the control unit 20 exposes (performs scanning exposure of) the exposure region on the substrate 15 while controlling focus driving of the substrate stage 16 so as to drive it with the upper limit driving amount.

In step S1008, the control unit 20 determines whether the information related to the approximate surface calculated in step S1002 exceeds a predetermined range. If the information related to the approximate surface calculated in step S1002 does not exceed the predetermined range, the process shifts to step S1010. On the other hand, if the information related to the approximate surface calculated in step S1002 exceeds the predetermined range, the process shifts to step S1012.

In step S1010, the control unit 20 exposes (performs scanning exposure of) the exposure region on the substrate 15 while controlling focus driving of the substrate stage 16 based on the focus correction value obtained from the approximate surface of the exposure region that has been exposed prior to the exposure region to be exposed.

In step S1012, the control unit 20 exposes (performs scanning exposure of) the exposure region on the substrate 15 while controlling focus driving of the substrate stage 16 based on the focus correction value obtained from the approximate surface calculated in step S1002.

Figure 13:
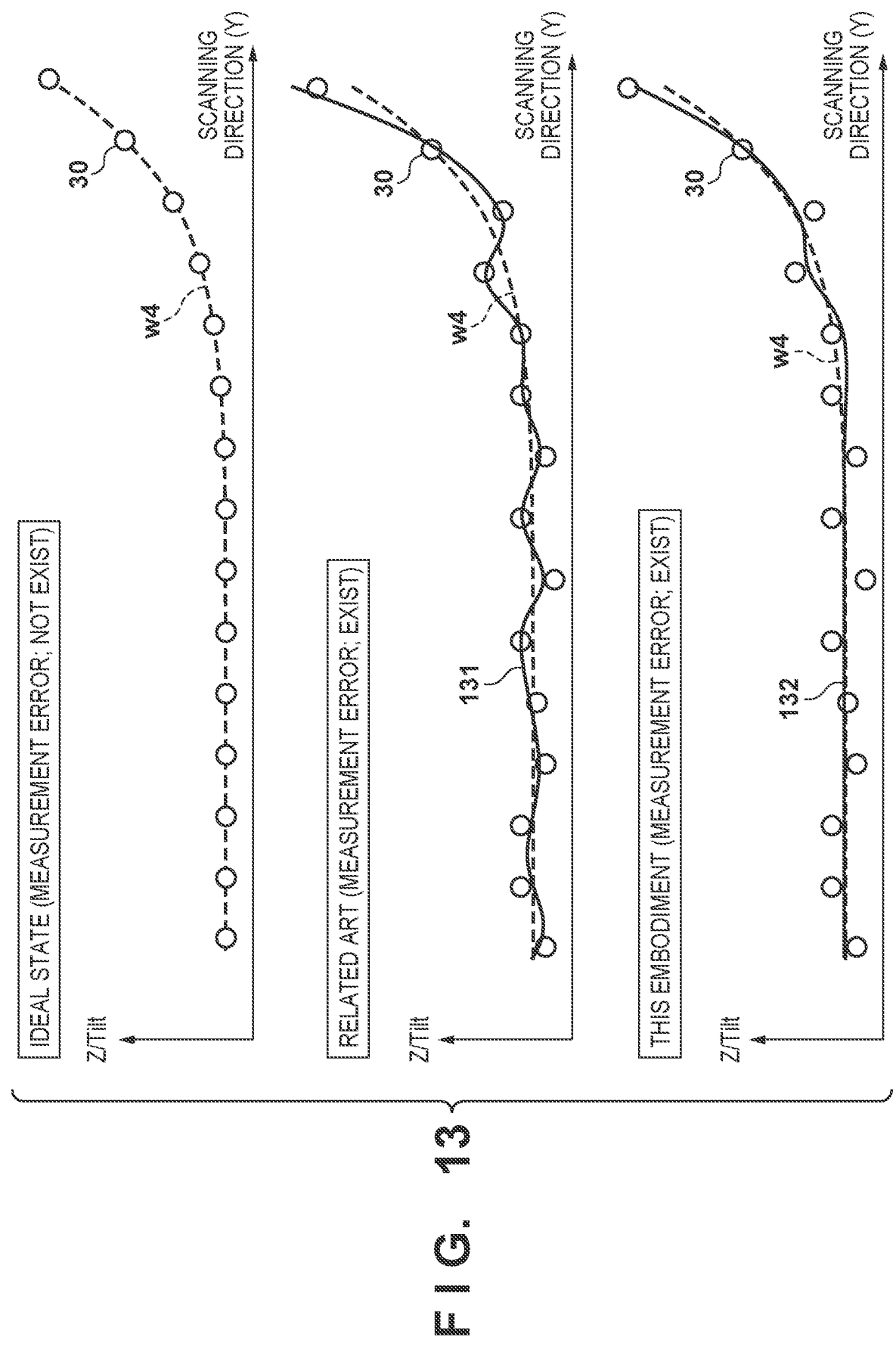
FIG. 13 is a view for explaining that a stage control residual is improved.

FIG. 13 is a view for explaining that a stage control residual (focus residual) is improved by the above-described exposure process. With reference to FIG. 13, in the ideal state in which the measurement result at each measurement point 30 includes no measurement error, the substrate stage 16 is driven along a cross-sectional shape w4 of the surface of the substrate 15 in focus driving, so no stage control residual is generated. However, according to the related art, if the measurement result at each measurement point 30 includes a measurement error, the substrate stage 16 is driven while largely deviating from the cross-sectional shape w4 of the surface of the substrate 15 in focus driving, and a large stage control residual 131 is generated. On the other hand, according to this embodiment, even if a measurement error is included at each measurement point 30, the substrate stage 16 is driven almost along the cross-sectional shape w4 without largely deviating from the cross-sectional shape w4 of the surface of the substrate 15 in focus driving. Therefore, in this embodiment, generation of a stage control residual 132 is suppressed, and the stage control deviation can be suppressed to the relatively small stage control residual 132.

In each embodiment described above, a case has been taken as an example and described in which the surface positions in the height direction at a plurality of measurement points in the exposure region to be exposed on the substrate 15 is measured using the third measurement unit 17 in the sequence of the exposure process. However, the preset invention is not limited to this. For example, the surface positions in the height direction at a plurality of measurement points in the exposure region to be exposed on the substrate 15 may be measured (preliminary measurement) using the third measurement unit 17 prior to the sequence of the exposure process. Alternatively, the surface positions in the height direction at a plurality of measurement points in the exposure region to be exposed on the substrate 15 may be measured (preliminarily) using an external measurement apparatus, and the surface positions may be obtained from the external measurement apparatus. In this case, the control unit 20 functions as an obtainment unit that obtains the surface positions in the height direction at the plurality of measurement points in the exposure region to be exposed on the substrate 15. Note that in preliminary measurement, the measurement origin of the substrate stage 16 may be measured a plurality of times at an interval smaller than the measurement interval of the measurement points 30 on the substrate. With this, it is possible to measure the surface position in the height direction with high accuracy in the entire surface of the substrate 15.

A method of manufacturing an article according to the embodiment of the present invention is suitable for manufacturing an article, for example, a liquid crystal display element, a semiconductor element, a flat panel display, or a MEMS. The manufacturing method includes a process of exposing, using the above-described exposure apparatus 80 or exposure method, a substrate to which a photoresist is applied, and a process of developing the exposed photoresist. In addition, an etching process, an ion implantation process, and the like are performed for the substrate using the pattern of the developed photoresist as a mask, thereby forming a circuit pattern on the substrate. By repeating the processes of exposure, development, etching, and the like, a circuit pattern formed by a plurality of layers is formed on the substrate. In the post-process, dicing (processing) is performed for the substrate on which the circuit pattern is formed, and chip mounting, bonding, and inspection processes are performed. The manufacturing method can also include other known processes (for example, oxidation, deposition, vapor deposition, doping, planarization, and resist removal). The method of manufacturing an article according to this embodiment is advantageous in at least one of the performance, quality, productivity, and production cost of the article, as compared to conventional methods.)

Note that the present invention does not limit a lithography apparatus to an exposure apparatus, and can apply the lithography apparatus to, for example, an imprint apparatus as well. The imprint apparatus brings a mold (original) and an imprint material arranged (supplied) on a substrate into contact with each other, and applies curing energy to the imprint material, thereby forming a pattern of a cured product to which a pattern of the mold has been transferred. The present invention is applicable to an external inspection apparatus for a substrate or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-203601 filed on Dec. 15, 2021, which is hereby incorporated by reference herein in its entirety.

What is claimed is:

1. An exposure apparatus for exposing a substrate via an original, the exposure apparatus comprising:
a substrate stage configured to hold the substrate;
an obtainment unit configured to obtain, for each of a plurality of exposure regions to be exposed on the substrate, surface positions in a height direction at a plurality of measurement points in the respective exposure region; and
a control unit configured to control, based on the surface positions obtained by the obtainment unit, driving of the substrate stage in the height direction during while exposing each of the plurality of exposure regions,
wherein the control unit:
obtains, for each of the plurality of exposure regions, an approximate surface approximately representing a cross-sectional shape of a surface of the respective exposure region from the surface positions obtained by the obtainment unit;
among the plurality of exposure regions, for a first exposure region for which information related to a first approximate surface of the first exposure region does not exceed a predetermined range, controls the driving based on a first correction value related to the driving obtained from a previous approximate surface approximately representing the cross-sectional shape of the surface of the exposure region that has been exposed before the first exposure region; and
among the plurality of exposure regions, for a second exposure region for which information related to a second approximate surface of the second exposure region exceeds the predetermined range, controls the driving based on a second correction value related to the driving obtained from the second approximate surface approximately representing the cross-sectional shape of the surface of the second exposure region.

2. The apparatus according to claim 1, wherein the control unit, among the plurality of exposure regions, for a third exposure region that is to be exposed first, controls the driving based on a third correction value related to the driving obtained from a third approximate surface of the third exposure region approximately representing the cross-sectional shape of the surface of the third exposure region.

3. The apparatus according to claim 1, wherein the obtainment unit includes a measurement unit configured to measure the surface positions.

4. The apparatus according to claim 3, wherein the predetermined range is set based on a measurement accuracy of the measurement unit with respect to the plurality of measurement points and a measurement range of the measurement unit with respect to the plurality of measurement points.

5. The apparatus according to claim 1, wherein the obtainment unit obtains the surface positions measured by an external measurement apparatus.

6. The apparatus according to claim 5, wherein the predetermine range is set based on a measurement accuracy of the external measurement apparatus with respect to the plurality of measurement points and a measurement range of the external measurement apparatus with respect to the plurality of measurement points.

7. The apparatus according to claim 4, wherein the measurement range is determined based on, among the plurality of measurement points, a measurement point at which the respective surface position is measurable.

8. The apparatus according to claim 4, wherein for each of the plurality of exposure regions, the predetermined range is set also based on a predicted cross-sectional shape of the surface of the respective exposure region.

9. The apparatus according to claim 8, wherein the previous approximate surface includes the predicted cross-sectional shape of the surface of the respective exposure region.

10. The apparatus according to claim 1, wherein the information related to the approximate surface includes at least one of a tilt of the approximate surface or a position of the approximate surface in the height direction.

11. An exposure method of exposing a substrate via an original, the method comprising:
    obtaining, for each of a plurality of exposure regions to be exposed on the substrate, surface positions in a height direction at a plurality of measurement points in the respective exposure region; and
    controlling, based on the obtained surface positions, driving of a substrate stage holding the substrate in the height direction during while exposing each of the plurality of exposure regions, wherein the controlling:
        obtains, for each of the plurality of exposure regions, an approximate surface approximately representing a cross-sectional shape of a surface of the respective exposure region from the obtained surface positions;
        among the plurality of exposure regions, for a first exposure region for which information related to a first approximate surface of the first exposure region does not exceed a predetermined range, controls the driving based on a first correction value related to the driving obtained from a previous approximate surface approximately representing the cross-sectional shape of the surface of the exposure region that has been exposed before the first exposure region; and
        among the plurality of exposure regions, for a second exposure region for which information related to a second approximate surface of the second exposure region exceeds the predetermined range, controls the driving based on a second correction value related to the driving obtained from the second approximate surface approximately representing the cross-sectional shape of the surface of the second exposure region.

12. A method of manufacturing an article, the method comprising:
    exposing a substrate via an original using an exposure method;
    developing the exposed substrate; and
    manufacturing the article from the developed substrate,
    wherein the exposure method comprises:
        obtaining, for each of a plurality of exposure regions to be exposed on the substrate, surface positions in a height direction at a plurality of measurement points in the respective exposure region; and
        controlling, based on the obtained surface positions, driving of a substrate stage holding the substrate in the height direction during while exposing each of the plurality of exposure regions, wherein the controlling:
            obtains, for each of the plurality of exposure regions, an approximate surface approximately representing a cross-sectional shape of a surface of the respective exposure region from the obtained surface positions;
            among the plurality of exposure regions, for a first exposure region for which information related to a first approximate surface of the first exposure region does not exceed a predetermined range, controls the driving based on a first correction value related to the driving obtained from a previous approximate surface approximately representing the cross-sectional shape of the surface of the exposure region that has been exposed before the first exposure region; and
            among the plurality of exposure regions, for a second exposure region for which information related to a second approximate surface of the second exposure region exceeds the predetermined range, controls the driving based on a second correction value related to the driving obtained from the second approximate surface approximately representing the second cross-sectional shape of the surface of the second exposure region.

* * * * *